(12) United States Patent
Katsuura et al.

(10) Patent No.: US 6,321,919 B1
(45) Date of Patent: Nov. 27, 2001

(54) FRAME STRUCTURE FOR HOUSING PANEL PLATES

(75) Inventors: Nobuo Katsuura; Sumito Hasegawa; Hitoshi Takano, all of Sagamihara (JP)

(73) Assignee: Nikko Kogyo Kabushiki Kaisha, Yokohama (JP)

( * ) Notice: Subject to any disclaimer, the term of this patent is extended or adjusted under 35 U.S.C. 154(b) by 0 days.

(21) Appl. No.: 09/671,577

(22) Filed: Sep. 27, 2000

(30) Foreign Application Priority Data

Jun. 12, 2000 (JP) .................................................. 12-175534

(51) Int. Cl.[7] ....................................................... A47F 5/00
(52) U.S. Cl. .......................................... 211/41.17; 361/801
(58) Field of Search ................................... 211/41.17, 26, 211/41.1, 4; 361/736, 740, 801

(56) References Cited

U.S. PATENT DOCUMENTS

| | | | |
|---|---|---|---|
| 3,902,603 | * | 9/1975 | Wilson .................................. 211/4 X |
| 3,926,490 | * | 12/1975 | Bertellotti . |
| 4,051,549 | * | 9/1977 | Fiege . |
| 4,067,444 | * | 1/1978 | Wilson .................................. 211/4 X |
| 4,418,820 | * | 12/1983 | Nagle et al. .................. 211/41.17 X |
| 4,761,044 | | 8/1988 | Akama et al. . |
| 4,964,810 | * | 10/1990 | Malotke et al. . |
| 5,128,833 | * | 7/1992 | Lin et al. . |
| 5,317,483 | * | 5/1994 | Swindler ............................... 361/801 |
| 5,797,487 | * | 8/1998 | Young . |

* cited by examiner

Primary Examiner—Robert W. Gibson, Jr.
(74) Attorney, Agent, or Firm—Oblon, Spivak, McClelland, Maier & Neustadt, P.C.

(57) ABSTRACT

A frame structure for housing panel plates includes a box-shaped structure having openings at opposite ends. The box structure includes a pair of side plates, the inner surfaces of which are provided with grooves for housing panel plates, two pairs of bases, one pair being affixed to the upper portions of the pair of side plates and the other pair being affixed to the lower portions of the pair of side plates, and two pairs of connecting plates, one pair connecting the one pair of bases at the upper portions and the other pair connecting the other pair of bases at the lower portions. Stop members are provided at the openings at the opposite ends to prevent housed panel plates from dropping out. A stop member support device has one end affixed to the base, and at the other end is a stop member support portion. The support device uses a cam mechanism to move the stop members between a first position at which the stop members are in contact with the panel plates, and a second position at which the stop members are not in contact with the panel plates.

11 Claims, 11 Drawing Sheets

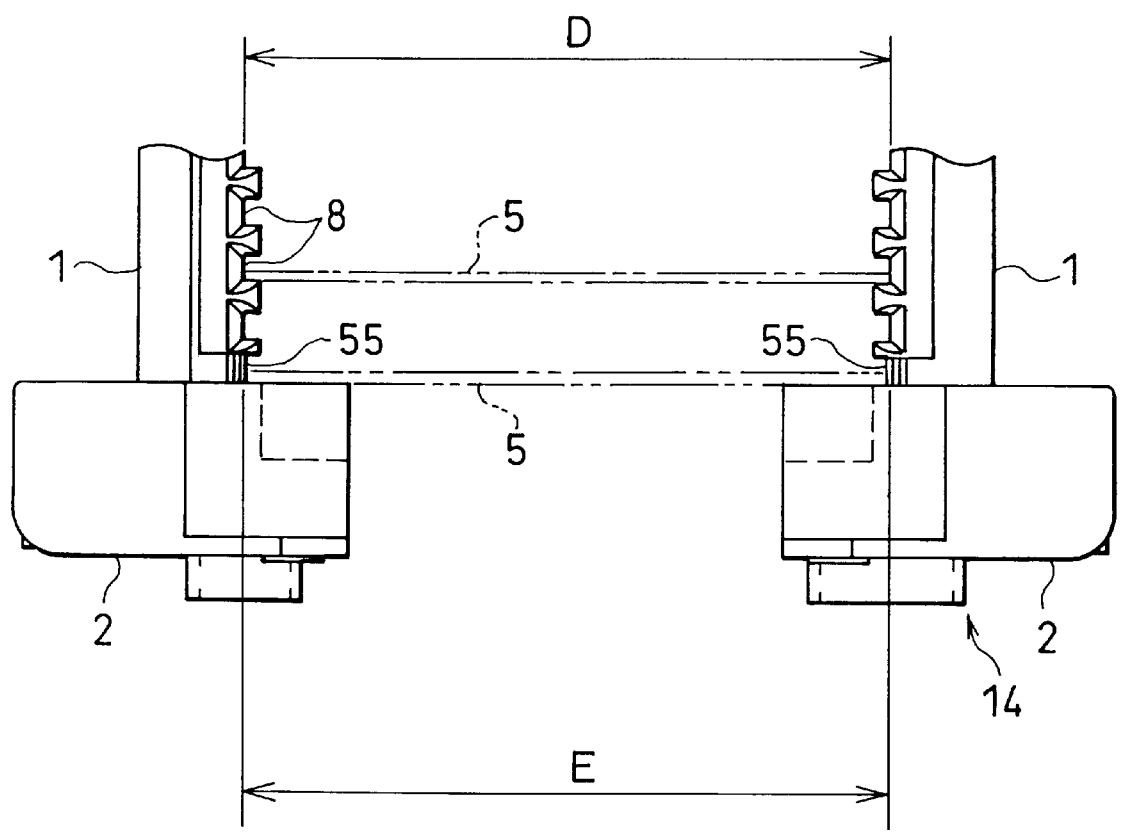

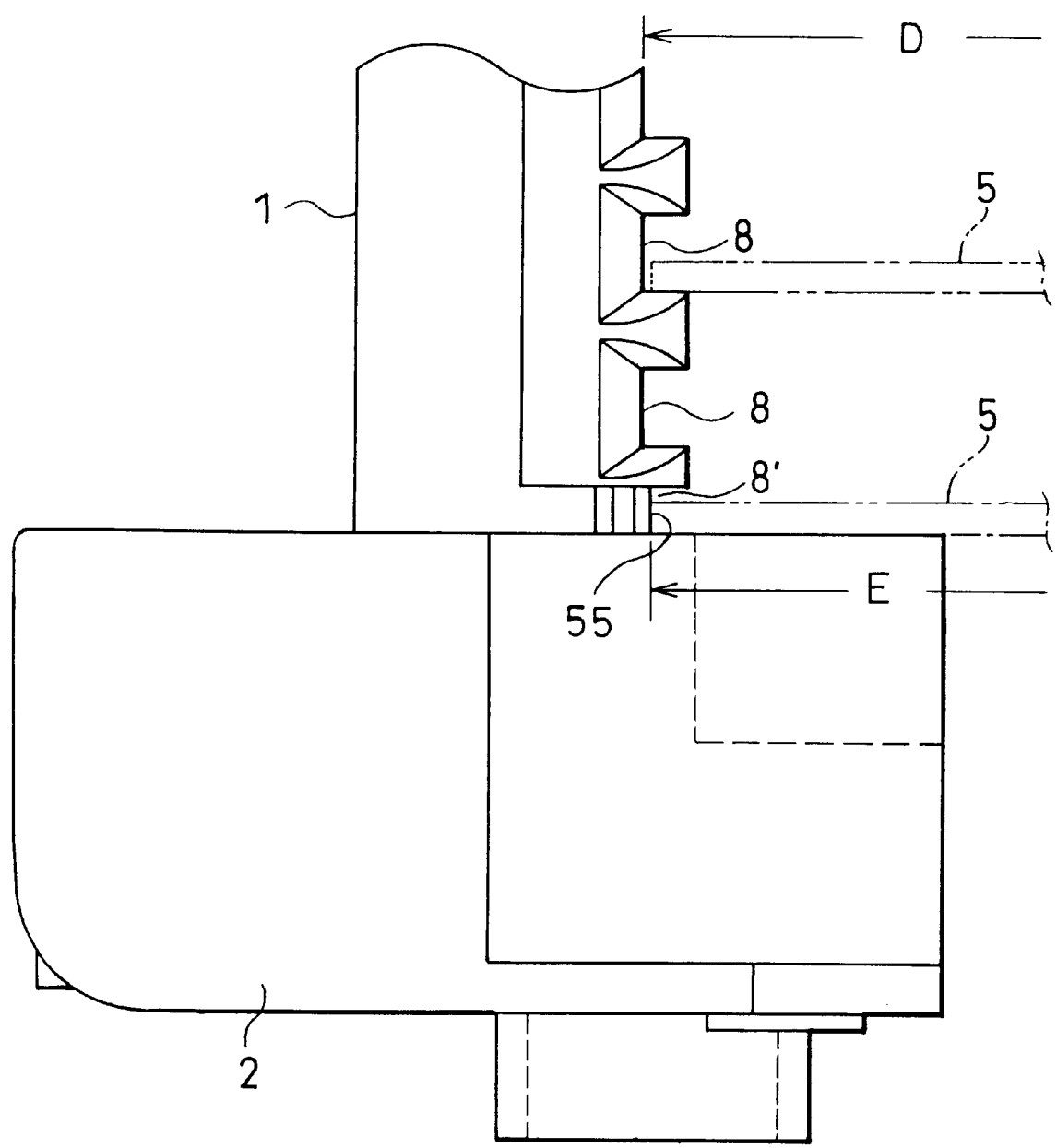

FRAME STRUCTURE FOR HOUSING PANEL PLATES

BACKGROUND OF THE INVENTION

1. Field of the Invention

This invention relates to a frame structure for housing panel plates such as printed circuit boards used in electrical and electronic devices and equipment, panels used in construction, and so forth. More particularly, the invention relates to a frame structure for housing panel plates that includes means for preventing the housed panel plates from breaking loose.

2. Description of the Prior Art

In order to prevent housed panel plates from breaking loose, housing frames have been provided with plate or rod shaped stops bolted in place, or with compression springs located at end portions to make the stops removable. Prior art stops have to be removed each time a panel plate is removed. As well as being inconvenient, the stops that have been removed can be lost, or it can be forgotten to affix the stops, allowing panel plates to fall and break.

To eliminate such drawbacks, JP-A-Sho 50-7068 discloses an apparatus, shown in FIG. 13, that prevents panel plates from coming out without involving removal of stops. As shown, the apparatus includes side plates 62, each of which is provided with a V-shaped guide groove 63. Each of the ends 65 of a stop rod 64 fits into the groove 63. A spring 66 is provided so that each end 65 of the stop rod 64 can stop at either one end of the V-shaped groove 63. The spring 66 urges the stop rod 64 towards the lower end of the groove, or towards the horizontal portion. When the stop rod 64 is at the lower end of the guide groove 63, the rod 64 abuts against the housed printed circuit boards 61, preventing the boards 61 from coming out of the apparatus. The boards 61 can be removed by moving the stop rod 64, against the tension of the spring 66, to the horizontal portion of the guide groove 63. The above configuration eliminates having to remove a stop rod each time a board was to be removed or inserted.

In the case of the above apparatus, however, it can readily happen that a non-uniform application of force to move the stop rod can result in a failure to keep the stop rod horizontal during the operation. A further drawback is that the size of the apparatus is increased by the need to provide enough space to provide the side plates with the V-shaped grooves and the springs. Also, since the springs project beyond the side plates, the springs are prone to being moved and dislodged by outside force.

Therefore, an object of the present invention is to provide a frame structure for housing panel plates that includes stop means for retaining the housed panel plates that can be moved for operation smoothly and securely.

SUMMARY OF THE INVENTION

In order to attain this object, the frame structure of the present invention comprises:

a box structure having openings at opposite ends, the box structure comprising a pair of side plates, inner surfaces of the side plates being provided with a plurality of grooves for supporting panel plates, two pairs of bases, one pair being affixed to upper portions of the pair of side plates and a remaining pair being affixed to lower portions of the pair of side plates, and two pairs of connecting plates, one pair connecting the one pair of bases at the upper portions and a remaining pair connecting the remaining pair of bases at the lower portions;

a pair of stop members provided at the openings at the opposite ends to prevent housed panel plates from coming out; and stop member support means having one end affixed to one base and another end that has a stop member support portion and which uses a cam mechanism to move the stop members between a first position at which the stop members are in contact with the panel plates, and a second position at which the stop members are not in contact with the panel plates.

The stop member support means comprises a first cam affixed to the base; a second cam having at one end the stop member support portion, the second cam rotating together with the stop member thus supported; and a spring member that urges the two cams towards each other; the stop members being moved between a first position at which the stop members are in contact with the panel plates, and a second position at which the stop members are not in contact with the panel plates.

As described above, the cam mechanism moves the stop members between open and closed positions. The movement of the stop members is smooth and the stop members are fixed at the open or closed position, preventing stop members being moved by mistake. The stop members can be formed of square bar or square pipe, one face of which contacts the housed panel plates, making the end faces of the panel plates less subject to damage.

The box structure can include a center partition stop structure that can be moved along the inside and outside of the panel plate support grooves on the side plates, making it possible to accommodate long and short panel plates. Also, the frame structure can be provided with connecting members to connect the pair of side plates in a way that allows the width of the accommodation space to be adjusted. Combining this with means for setting the width of the space used to accommodate the panel plates makes it possible to readily set the width between the side plates to provide a desired clearance.

Further features of the invention, its nature and various advantages will be more apparent from the accompanying drawings and following detailed description of the invention.

BRIEF DESCRIPTION OF THE DRAWINGS

FIG. 11 is a diagram illustrating the means of setting the housing width of the frame structure according to the present invention.

FIG. 12 is an enlarged view of the essential parts of FIG. 11.

DESCRIPTION OF THE PREFERRED EMBODIMENT

Figure 1:
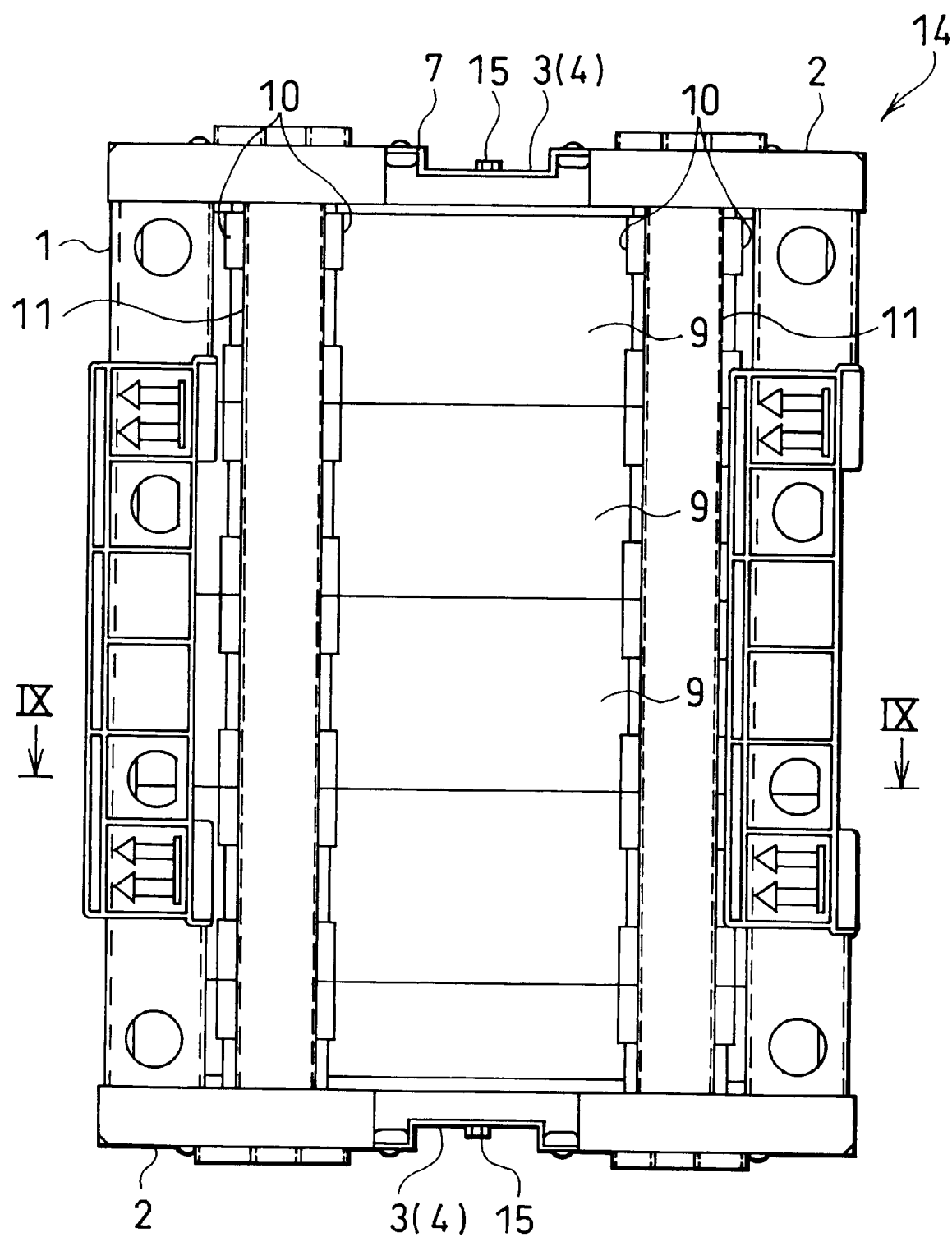
FIG. 1 is a front view showing a frame structure for housing panel plates according to one embodiment of the present invention.
Figure 2:
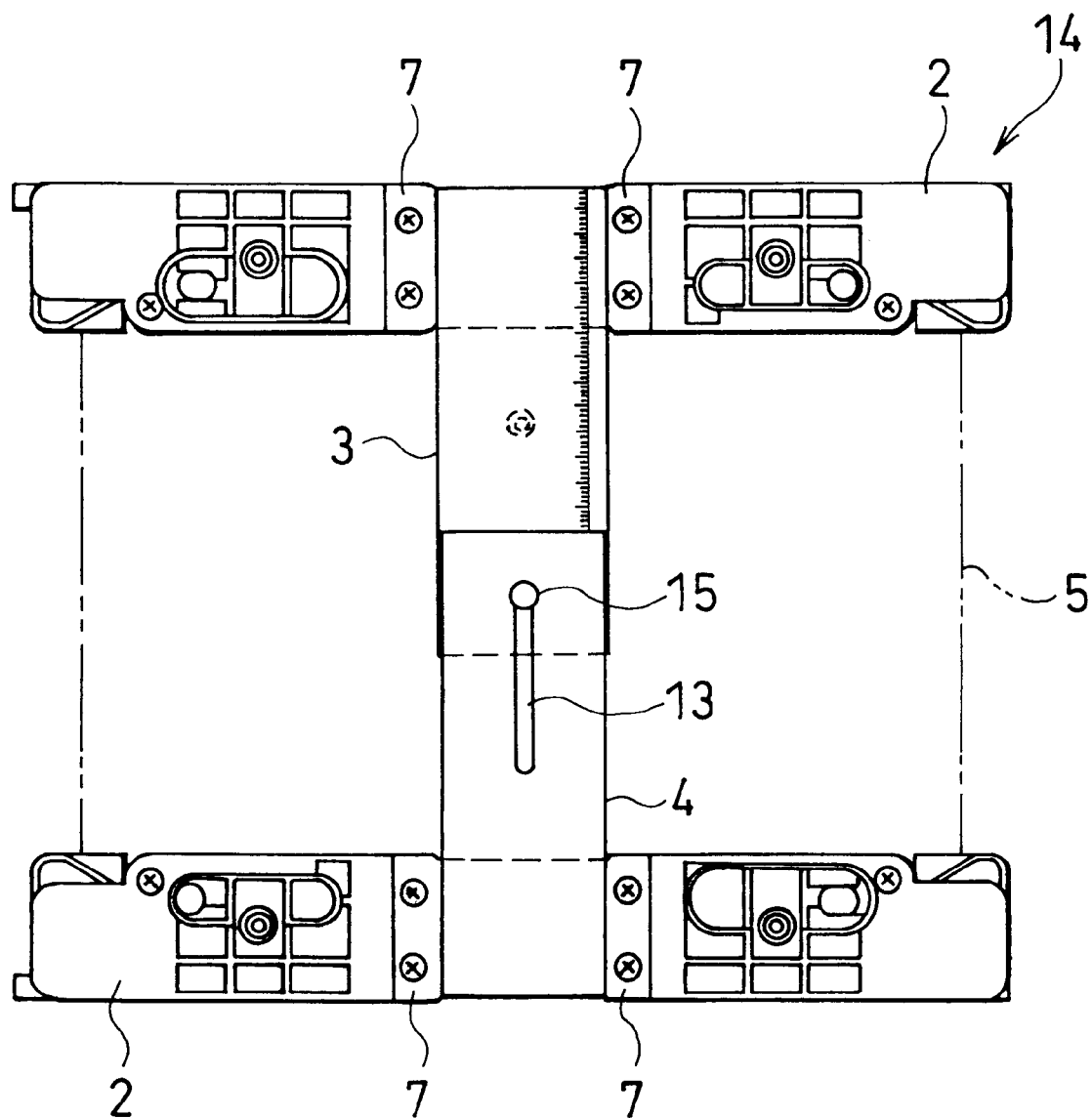
FIG. 2 is a plan view of the frame structure of FIG. 1.
Figure 3:
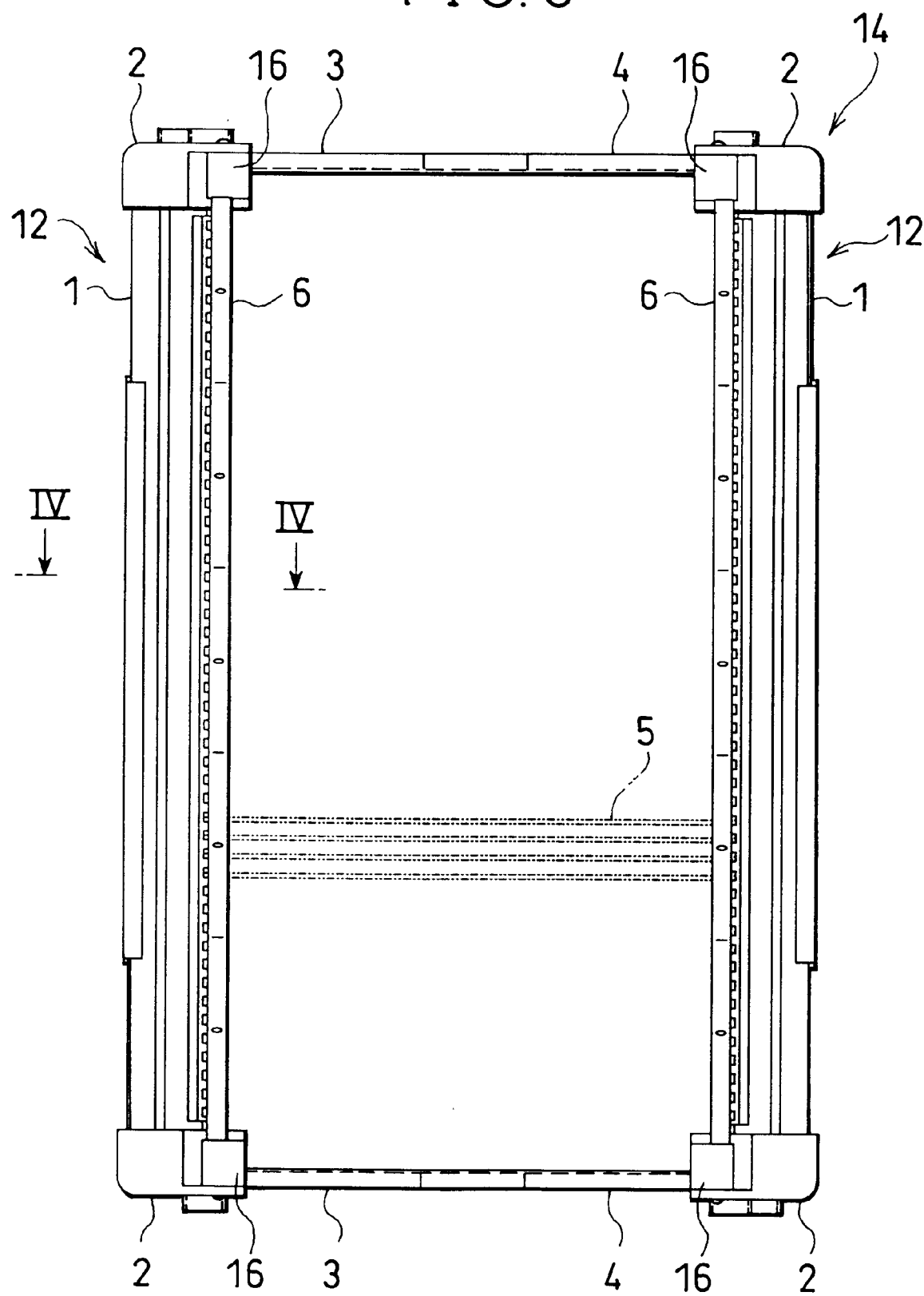
FIG. 3 is a side view of the frame structure of FIG. 1.

An embodiment of the frame structure of the present invention is illustrated in FIGS. 1 to 3. The frame structure 14 comprises a pair of opposed side plates 1, a pair of bases 2 affixed to the upper portions and lower portions of the pair of side plates 1, and a pair of connecting plates 3 and 4 that connect the facing sides of the pair of bases 2, forming a box with openings at opposite ends via which panel plates 5 can be housed. To prevent the panel plates 5 thus housed from coming out, each base 2 is provided at one end with a stop member support 16 for supporting stop members 6.

Figure 4:
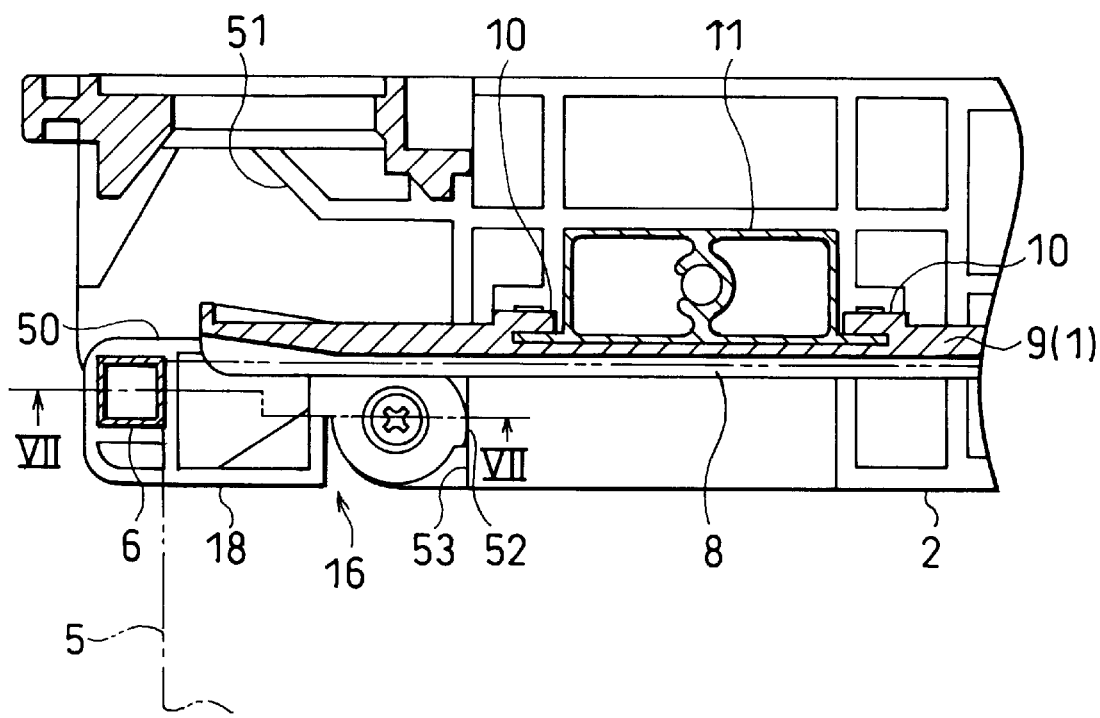
FIG. 4 is a cross-sectional view along line IV—IV of FIG. 3, showing a stop member in the closed position in which it is in abutment with the panel plates.

In this embodiment, each of the opposed side plates 1 is composed of a plurality of small unit plates 9 each of which has parallel support grooves 8 formed on its inner surface to house panel plates 5. Each of the unit plates 9 is provided with a pair of hooks 10 positioned slightly inboard of each edge portion on its outer surface, such as to face each other across their openings. As shown in FIG. 4, a plurality of such unit plates 9 are stacked vertically and the web of a hat form 11 is inserted into the space defined by the vertically aligned pairs of hooks 10 on each side, forming a unitary structure. The end of each hat form 11 is fitted into a groove provided in the base 2 and is bolted in place, affixing the side plates 1 to the base 2 to form a unitary board 12.

As shown in the plan view of FIG. 2, the bases 2 at both ends of one side plate 1 are affixed to one end of the connecting plate 3 by means of anchor portions 7, and the bases 2 of the other side plate 1 are similarly affixed to one end of the connecting plate 4. The other end of the connecting plate 3 has a bolt 15 affixed thereto. The other end of the connecting plate 4 has a slot 13 through which the bolt 15 is inserted. When the spacing between the side plates 1 is set using the bolt 15 and slot 13 according to the width of the panel plates to be housed, a nut is used to fix the connecting plates 3 and 4. The attachment of the connecting plates 3 and 4 is similarly implemented with respect to the bases 2 provided at the lower end of the side plates.

FIG. 11 illustrates how the spacing between the side plates 1 is set to match the panel plates 5 to be housed. To facilitate understanding, stop members and the like are not shown. FIG. 12 is an enlarged view of the essential parts of FIG. 11. In the drawing, E denotes the width of a housed panel plate 5, and D denotes the width to be set, which is around 1 mm wider than width E.

As described above, in order to set the distance between the facing support grooves 8 of the side plates 1 to D, the top and bottom support grooves 8 are grooves 8' having a spacing adjusting projection 55 for providing a predetermined upper and lower clearance on the inner surface. Plates to be housed are inserted in these grooves 8', and the side plates 1 are pushed inwards and the connecting plates 3 and 4 fixed. Employing this means of setting the housing width for plates makes it possible to readily set the spacing between the facing grooves of the side plates to width D having a suitable clearance for readily inserting and removing panel plates. In this embodiment of the invention, the connecting plates are provided with means for adjusting the spacing between the side plates 1, but can also be applied to frame structures for housing panel plates having no means of adjusting the spacing. Also, instead of a base, top and bottom plates can be used, with one of the plates being movable and the other fixed. Thus, the side plates 1 set to have a predetermined distance therebetween to form a box-shaped structure having openings at the opposite ends via which panel plates can be removably housed.

Figure 9:
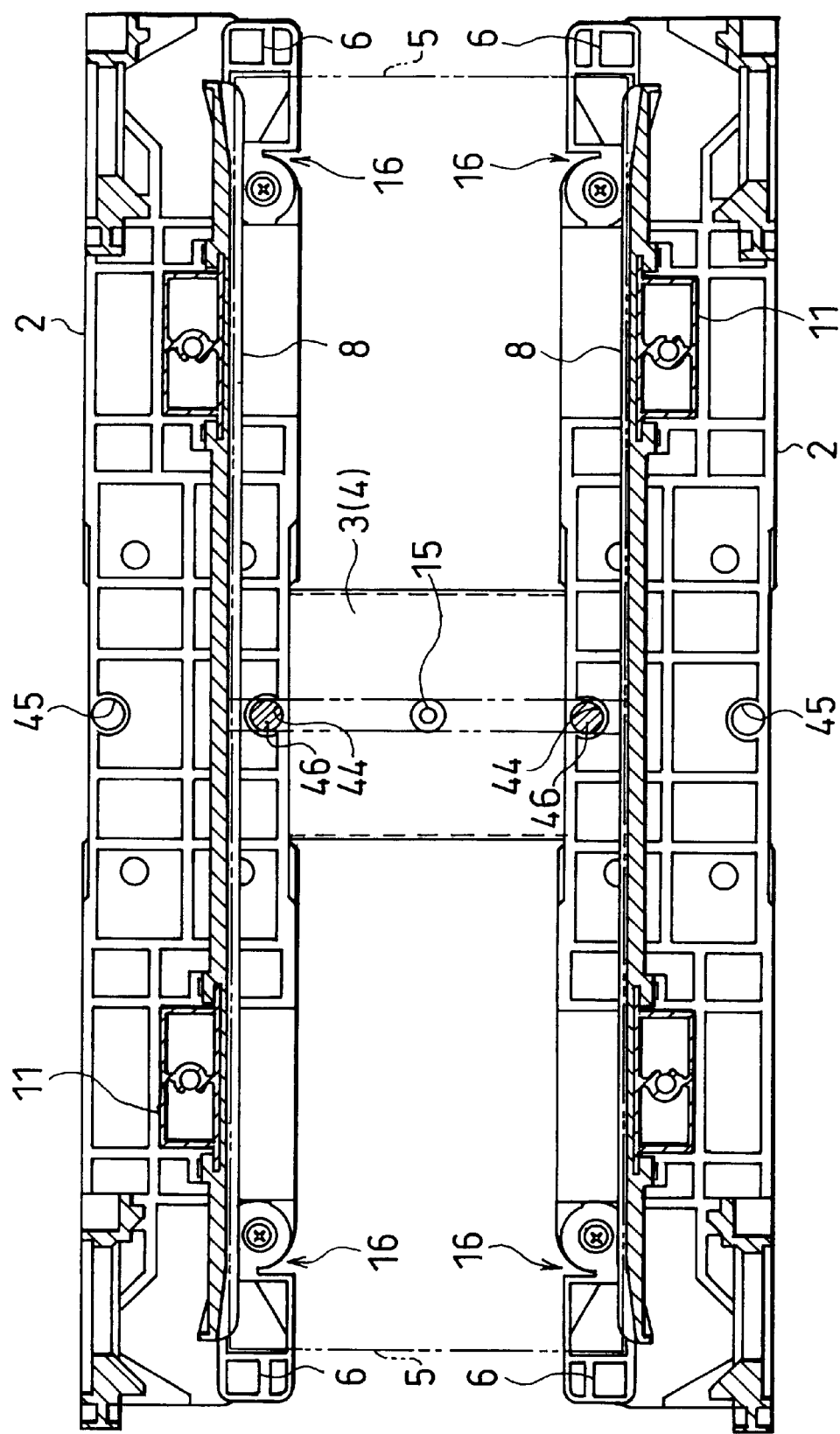
FIG. 9 is a cross-sectional view along line IX—IX of FIG. 1.

FIG. 9 shows an embodiment in which center stop housing portions 44 and 45 are provided on the inner and outer sides of the support grooves 8. When the panel plates 5 to be housed have more or less the same length as the side plates 1, a partitioning center stop member 46 is housed in the center stop housing portion 45 on the outer side of the support grooves 8. When the panel plates 5 are not more than half as long as the side plates 1, the center stop member 46 can be pushed down against the force of a spring provided at the lower end, releasing the center stop member 46 from the center stop housing portion 44, and moved to a housing portion 44 on the inner side of the support grooves 8, where it is held in place by the force of the spring, thus dividing the panel plate housing into two parts, each having an end opening via which the panel plates are inserted.

Figure 6:
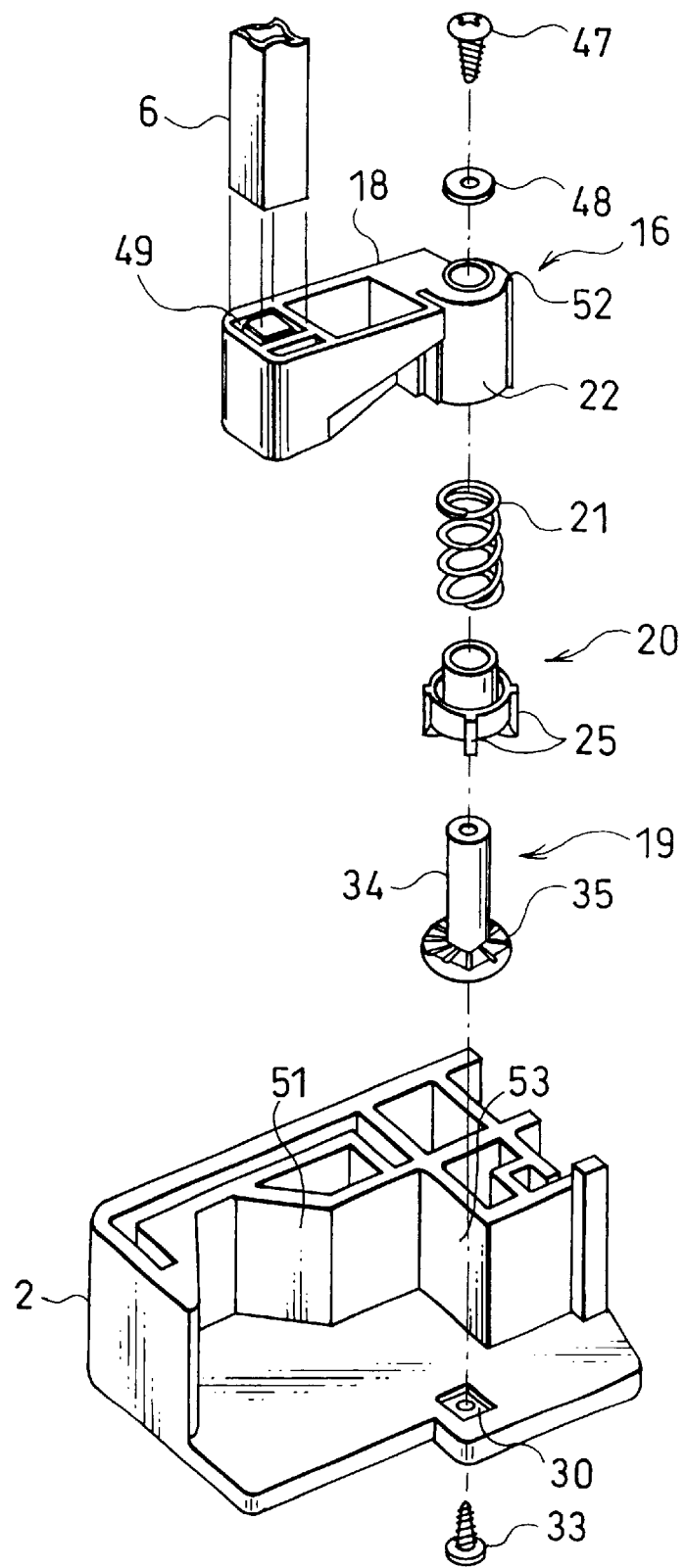
FIG. 6 is an exploded perspective view of the stop member support.
Figure 7:
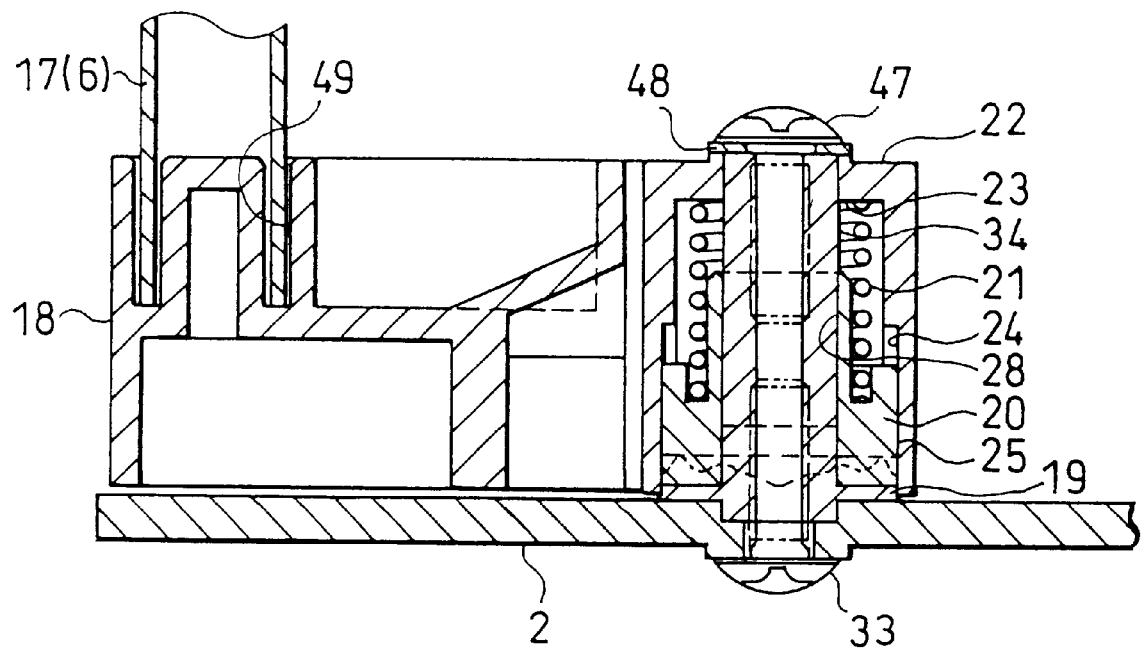
FIG. 7 is a cross-sectional view along line VII—VII of FIG. 4.

FIG. 6 shows an exploded view of the stop member support 16, and FIG. 7 shows an assembled view. The stop member support 16 includes a recess 49 at the front end that accommodates stop member 6; an arm 18 at the back end having a cylindrical portion 22 that houses a cam, described later; a first cam 19 attached to the base 2; a second cam 20 that is in pressure contact with the first cam 19 and rotates together with the arm 18; and a compression spring 21 housed in the cylindrical portion 22 that urges the second cam 20 towards the first cam 19.

While the stop member 6 that fits into the recess 49 may be round or strip-shaped, it is preferable for it to have a shape so that housed panel plates 5 are retained in a flat surface contact state. Although the stop member 6 shown in FIG. 6 is square, it is to be understood that it could equally well be rectangular, since that would also enable a panel plate 5 to be retained by a flat surface. Moreover, although this embodiment shows the stop member 6 and arm 18 as separately formed parts, the stop member 6 and arm 18 can be formed in one piece of plastic or the like.

As shown in FIG. 7, the cylindrical portion 22 of the arm 18 contains the compression spring 21, one end of which presses against an inner end surface 23, and the second cam 20, which is in abutment contact with the other end of the spring 21. A guide groove 24 is formed in the inside wall of the cylindrical portion 22. The peripheral surface of the second cam 20 is provided with a plurality of guide projections 25. The guide projections 25 engage with the guide groove 24, whereby the second cam 20 rotates together with the arm 18.

Figure 8:
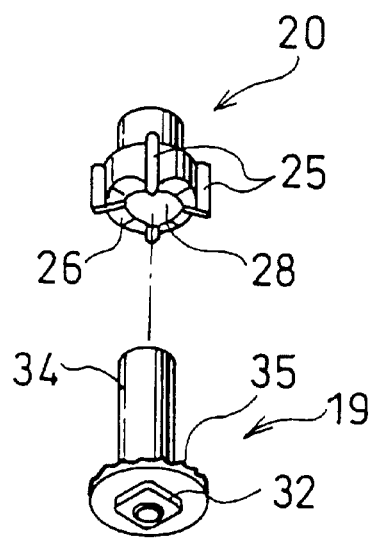
FIG. 8 is a perspective view showing the structure of the cam portion of the stop member shown in FIG. 6.

FIG. 8 is a perspective view of the first and second cams 19 and 20, seen from a different angle than that of FIG. 6. As shown, the second cam surface on the side opposite to the surface in contact with the spring 21 is formed as an up-and-down portion 26. The second cam 20 also has a through-hole 28 extending axially for insertion of the shaft 34 of the first cam 19. The first cam 19 has a fixing projection 32 formed on the opposite side to the cam face 35. The fixing projection 32 engages with a fixing recess 30 formed at the location position of the stop support 16 on the base 2, and is affixed by means of a screw 33 or the like, thus preventing the first cam 19 from rotating on the base 2. The side opposite to the fixing projection 32 is provided with first cam face 35 and the shaft 34 that inserts into the through-hole 28 of the second cam 20.

To attach the stop member 6 to the base 2 using the stop member support 16 having the above configuration, first the shaft 34 of the first cam 19 is inserted into the second cam 20 and compression spring 21, and then up into the cylindrical portion 22 of the arm 18, and is held in place by a screw 47 and washer 48. Thus, the stop member support 16 is assembled with the open end of the cylindrical portion 22 covered by the first cam 19, which is urged against the second cam 20 by the force of the spring 21.

Two of these stop member support 16 assemblies are prepared, and the ends of the stop member 6 are inserted into the recess 49 of each arm 18. In this engaged state, screws 33 are used to affix the upper stop member support 16 to the upper base 2 and the lower stop member support 16 to the lower base 2, thereby attaching the stop member 6 in the vicinity of the housing frame opening. In the above-described embodiment, a stop member support 16 is provided at each end of the stop member 6. However, if a strongly rigid stop member support 16 is used, a support 16 need only be provided at one end.

The cam face of the first cam 19 comprises a portion 35 on which peaks alternate with valleys about the axis of rotation. The surface of the second cam 20 that is pushed into contact with the first cam 19 is formed as an up-and-down portion 26. FIG. 10 illustrates the state of progressive contact between the first cam 19 and the second cam 20. Following the direction of rotation of the stop member 6, the cam face 35 of the first cam 19 comprises four repetitions of a first up-slope 37, first crest 38, first down-slope 39, first bottom 40, second up-slope 41, second crest 42, and second down-slope 43. Thus, one cam cycle covers 90 degrees of rotation. Although in this embodiment the first cam surface is provided with four faces per 90 degrees to provide stable contact with the four crests 27 of the second cam around the whole periphery thereof, the number of risers and descenders and the placement of crests and the like can be decided based on considerations of opening angle and so forth.

Figure 10A:
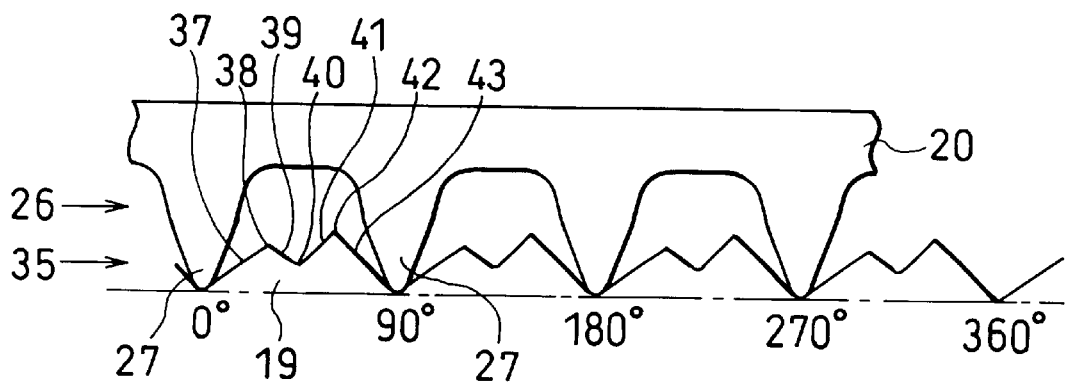
FIGS. 10(*a*), 10(*b*) and 10(*c*) are diagrams illustrating the pressure contact state between the first and second cams of the invention.
Figure 10B:
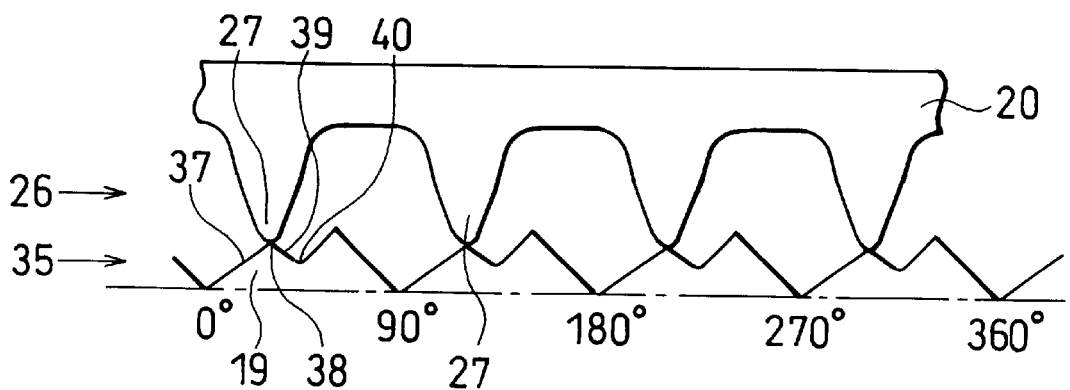
Figure 10C:
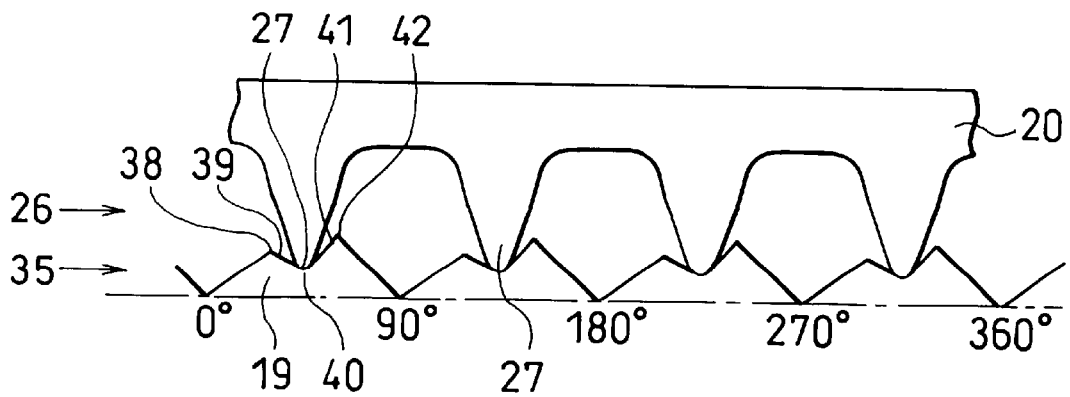
Figure 13:
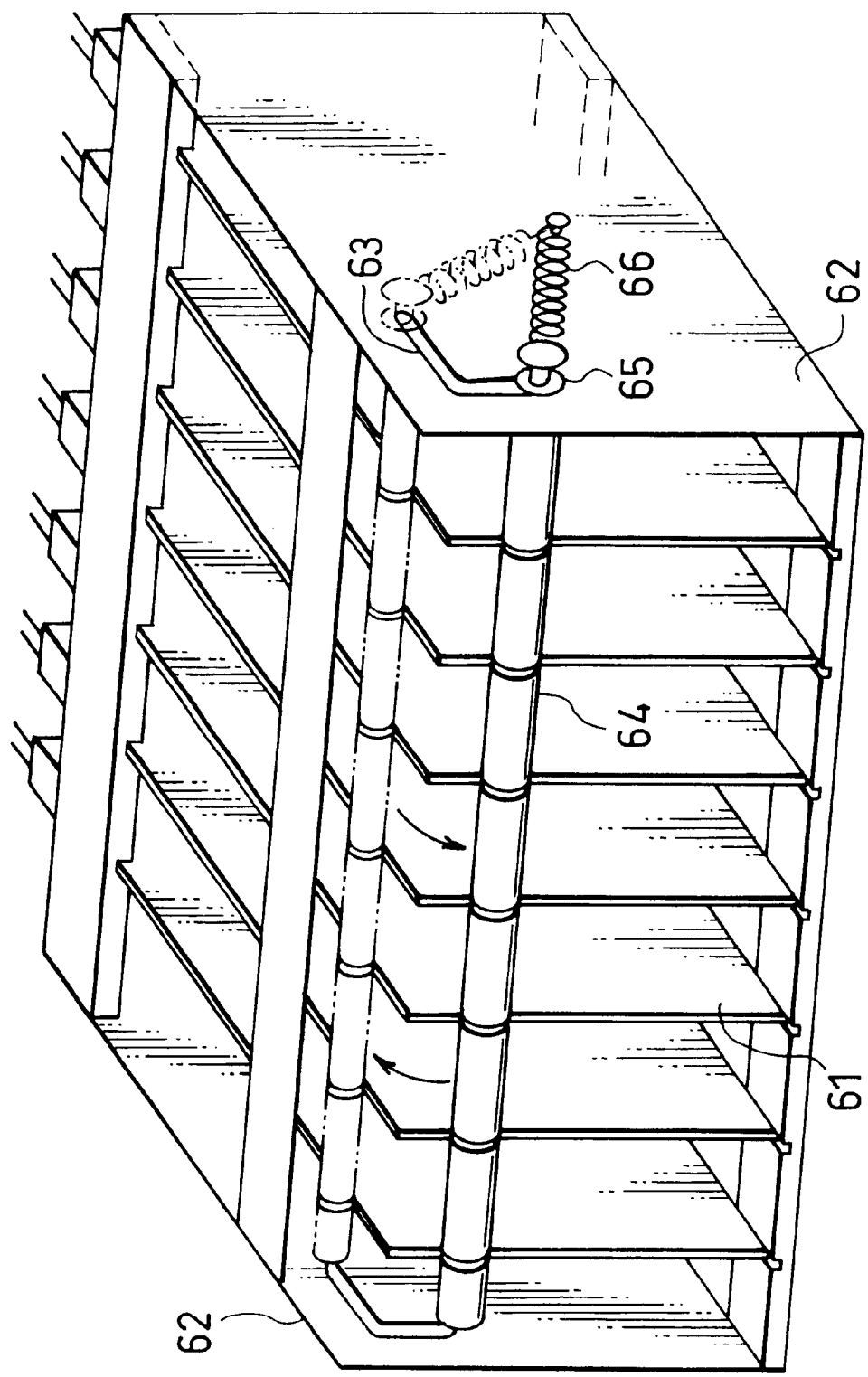
FIG. 13 is a perspective view showing a prior art frame structure.

The operation of the cam mechanism of the stop support 16 will now be described in further detail, with reference to FIG. 10. FIG. 10(a) shows contact between the first and second cams 19 and 20 when there are panel plates 5 housed in the frame structure 14 and the stop member 6 is closed. FIG. 10(b) shows the contact between the cams 19 and 20 when the stop member 6 is slightly open, breaking the contact with the panel plates. FIG. 10(c) shows the contact between the cams 19 and 20 when the stop member 6 is fully open. With respect first to FIG. 10(a) relating to a state in which, as shown in FIG. 4, panel plates 5 are housed in the structure and the stop member 6 is in the closed position (angle of rotation of zero degrees) in contact with the panel plates. Here, each crest 27 of the second cam 20 is stably located in a valley of the cam face 35 of the first cam face 19. When the stop member 6 is rotated outward from this closed position, until the rotation causes the crest 27 of the up-and down portion 26 of the second cam 20 to reach the first crest 38 of the first cam face 35, the crest 27 is subject to the force of the spring 21 and the first up-slope 37, urging the crest 27 back towards the zero-degrees closed position.

Figure 5:
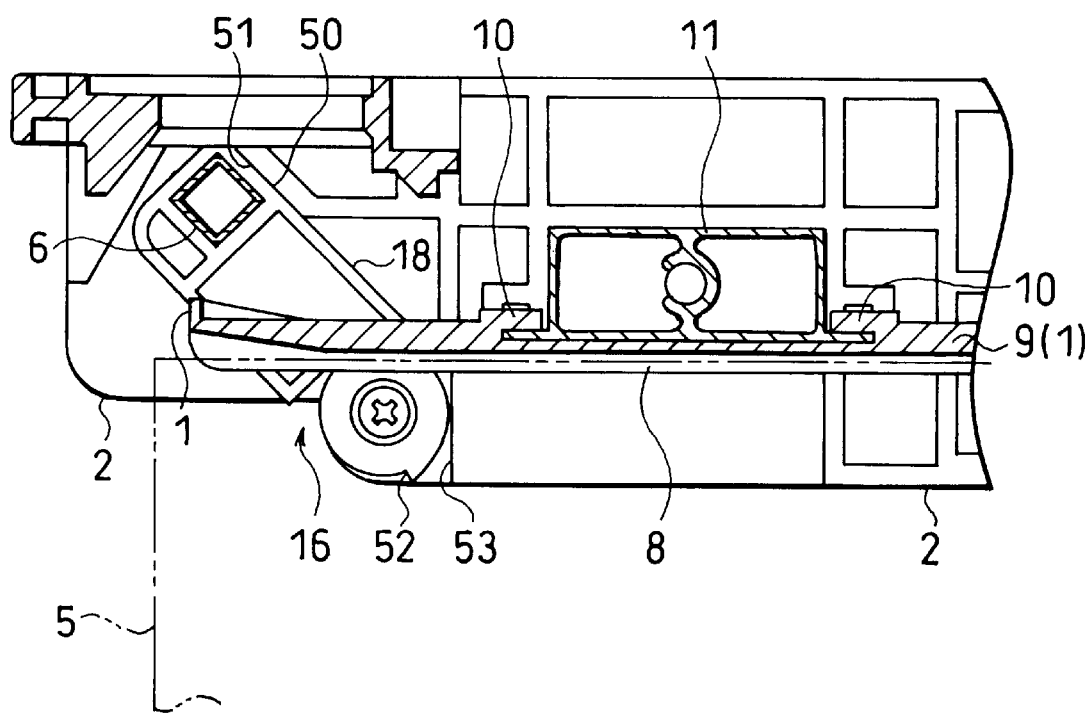
FIG. 5 is a cross-sectional view, like FIG. 4, showing a stop member in the open position in which it is not in abutment with the panel plates.

When, as shown in FIG. 10(b), the stop member 6 exceeds a predetermined opening angle (which is when the crest 27 of the second cam 20 has reached the crest 38 of the first cam face 35), the force of the spring 21 and the first down-slope 39 urge the crest 27 forward, to the first bottom 40. This is the state in which the stop member 6 is open, as shown in FIG. 5, making it possible to remove panel plates 5 from the frame structure. When further rotation moves the crest 27 past the first bottom 40, the force of the spring 21 and the somewhat steeper second up-slope 41 again act to try to push the crest 27 back toward the first bottom 40, in addition to which, before the second crest 42 is reached, the outer side 50 of the arm 18 contacts the wall 51 of the base 2, whereby the crest 27 is securely locked in place by the bottom 40 of the first cam.

To return to the closed position, the stop member 6 is rotated in the opposite direction. When the angle of rotation takes the crest 27 back past the crest 38 to the vicinity of the zero degrees position, the force of the spring 21 and the first up-slope 37 makes it possible to readily return to the zero degree (closed) position. Incorrect operation can be prevented by providing the side of the arm 18 with a turn-stop 52 that abuts against the base wall when the angle is zero degree (FIG. 4).

Because a cam mechanism is employed in the stop member support 16, almost no base 2 space is required, as it is only necessary to provide a first cam 19 fixing hole in the base 2. Thus, the configuration is more space-saving than the conventional one using springs. Also, compared to round bar, forming the stop member 6 of square bar or pipe makes it easier to provide a label portion and, as shown in FIG. 3, makes the label portion easier to see. A label portion can be provided inside as well as on the front, making it possible to check the label when the frame structure is in the open position, obscuring the front label.

Although the foregoing embodiment has been described with reference to a configuration in which the first cam 19 is provided on the base 2 and the second cam 20 is provided to turn in conjunction with the stop member 6, this is not limitative. Since it is only necessary to achieve relative rotation between the two, the positions can be reversed.

The present invention thus configured has the following effects.

Since in the cam mechanism used to operate the stop member that retains panel plates housed in the frame structure, the open and closed positions are both fixed, the stop member moving along the cam face is always fixed in either the open or closed position, providing a secure and positive locking and unlocking operation. The stop can be readily locked and unlocked, and since the stop bar is not removed, damage to housed printed circuit boards and the like caused by the boards falling out of the housing because an operator forgot to attach the stop bar is eliminated.

Moreover, since the stop member is formed of square bar or pipe, the stop member retains the housed panel plates through a surface rather than a point contact. There is also less slippage with a square-shaped stop, making it easier, in conjunction with the cam mechanism, to keep the stop member parallel while it is being moved. A flat surface is also easier to label, and makes the label easier to read. It also makes it easier to also place a label inside, ensuring that one label will always be visible.

Furthermore, using a center partition stop member that in use can be moved to inner panel plate support grooves on the side plates, and when not in use can be moved to outer support grooves, makes it possible to insert short panel plates from both sides.

Also, as the frame structure is provided with connecting members that connect the pair of side plates in a way that allows the width of the accommodation space to be adjusted, it is possible to readily set a distance between the side plates that provides a predetermined clearance, thereby facilitating the smooth insertion and withdrawal of the panel plates.

The cam mechanism configuration includes a first cam on the base, a second cam that rotates in conjunction with the stop member, and a compression spring that urges the cams into contact. The spring force on the stop member keeps the cam surfaces in contact during rotation and locks the stop member in the closed position at one side of a cam crest, or the unlocked position at the other side of the crest. This prevents inadvertent movement of the stop member. Moreover, the base only needs to be large enough to affix the second cam, so that even the addition of the stop member support does not result in a bulky frame structure.

What is claimed is:

1. A frame structure for housing panel plates, comprising:

a box structure having openings at opposite ends, said box structure comprising a pair of side plates, inner surfaces of said side plates being provided with a plurality of grooves for supporting panel plates, two pairs of bases, one pair being affixed to upper portions of the pair of side plates and a remaining pair being affixed to lower portions of the pair of side plates, and two pairs of connecting plates, one pair connecting the one pair of bases at said upper portions and a remaining pair connecting the remaining pair of bases at said lower portions;

a pair of stop members provided at the openings at the opposite ends to prevent housed panel plates from coming out; and stop member support means having one end affixed to one base and another end that has a stop member support portion and which uses a cam mechanism to move the stop members between a first position at which the stop members are in contact with the panel plates, and a second position at which the stop members are not in contact with the panel plates.

2. The frame structure according to claim 1, wherein the stop members are formed of square bar or square pipe.

3. The frame structure according to claim 1, wherein the box structure includes a partitioning center stop that can be moved along inside and outside of the panel plate support grooves on the side plates.

4. The frame structure according to claim 1, wherein each of the pair of side plates is comprised of a plurality of narrow unit plates.

5. The frame structure according to claim 1, wherein the pair of side plates has means for setting a width of a housing space.

6. The frame structure according to claim 1, wherein the stop member support means comprises a first cam affixed to each base; a second cam that rotates together with each stop member thus supported, and a spring member that urges the two cams towards each other.

7. A frame structure for housing panel plates, comprising:

a box structure having openings at opposite ends, said box structure comprising a pair of side plates, inner surfaces of said side plates being provided with a plurality of grooves for supporting panel plates, two pairs of bases, one pair being affixed to upper portions of the pair of side plates and a remaining pair being affixed to lower portions of the pair of side plates, and two pairs of connecting plates, one pair connecting the one pair of bases at said upper portions and a remaining pair connecting the remaining pair of bases at said lower portions, and each pair setting a spacing between the pair of side plates;

a pair of stop members provided at the openings at the opposite ends to prevent housed panel plates from coming out; and stop member support means comprising a first cam affixed to each base; a second cam having at one end a stop member support portion, said second cam rotating together with each stop member thus supported, and a spring member that urges the two cams towards each other, said stop member support means, moving the stop members between a first position at which the stop members are in contact with housed panel plates, and a second position at which the stop members are not in contact with the panel plates.

8. The frame structure according to claim 7, wherein the stop members are formed of square bar or square pipe.

9. The frame structure according to claim 7, wherein the box structure includes a partitioning center stop that can be moved along inside and outside of panel plate support grooves on the side plates.

10. The frame structure according to claim 7, wherein each of the pair of side plates is comprised of a plurality of narrow unit plates.

11. The frame structure according to claim 7, wherein the pair of side plates has means for setting a width of a housing space.

* * * * *